United States Patent [19]
Iwasaki

[11] Patent Number: 5,068,549
[45] Date of Patent: Nov. 26, 1991

[54] SEMICONDUCTOR INTEGRATED CIRCUIT APPARATUS HAVING PROGRAMMABLE LOGIC DEVICE

[75] Inventor: Hiroshi Iwasaki, Yokohama, Japan

[73] Assignee: Kabushiki Kaisha Toshiba, Kawasaki, Japan

[21] Appl. No.: 614,261

[22] Filed: Nov. 16, 1990

[30] Foreign Application Priority Data

Nov. 20, 1989 [JP] Japan .................. 1-299856

[51] Int. Cl.$^5$ ..................... H03K 19/177; H03K 5/08; H03K 19/092; H03K 3/01
[52] U.S. Cl. ................. 307/465.1; 307/468; 307/202.1; 364/784
[58] Field of Search ..................... 307/465, 465.1, 468, 307/469, 202.1

[56] References Cited
U.S. PATENT DOCUMENTS

| | | | |
|---|---|---|---|
| 4,652,777 | 3/1987 | Cline | 307/465.1 X |
| 4,703,206 | 10/1987 | Cavlan | 307/202.1 X |
| 4,937,465 | 6/1990 | Johnson et al. | 307/202.1 |
| 4,975,602 | 12/1990 | Nhu | 307/465 X |
| 5,015,886 | 5/1991 | Choi et al. | 307/465 |

Primary Examiner—Edward P. Westin
Assistant Examiner—David R. Bertelson
Attorney, Agent, or Firm—Finnegan, Henderson, Farabow, Garrett, and Dunner

[57] ABSTRACT

According to this invention, there is disclosed a semiconductor integrated circuit apparatus having a programmable logic gate wherein whether an opening for connecting a metal wire in a programming region is present or absent is determined in a manufacturing step by determining the content of a program in the programming region, and the program is performed by determining whether a programming element is connected to the metal wire through the opening or not.

10 Claims, 5 Drawing Sheets

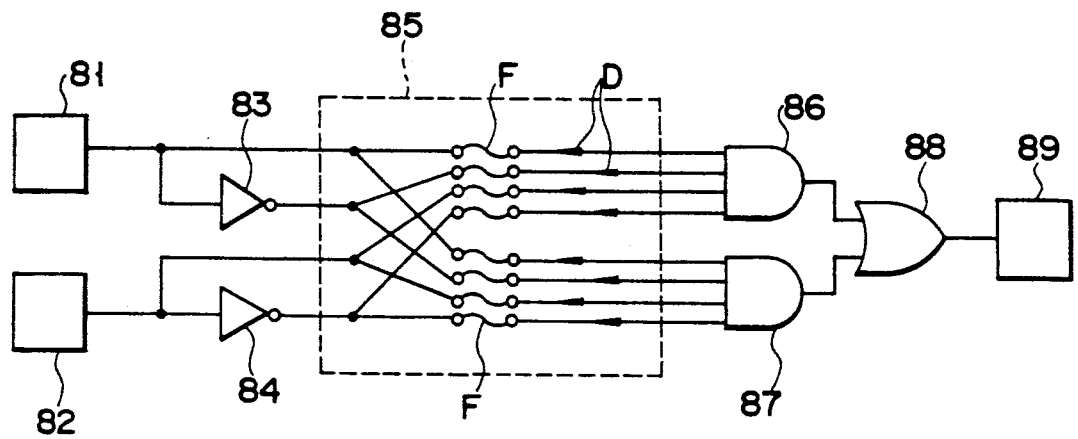
F I G. 1
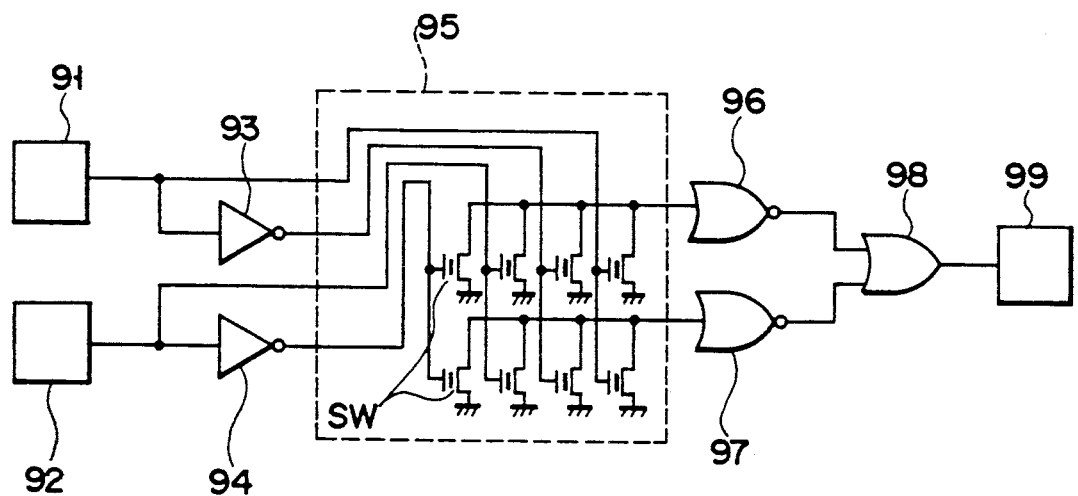
F I G. 2

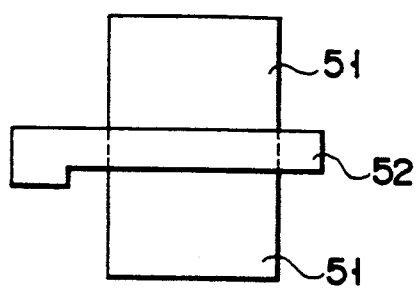
F I G. 7A
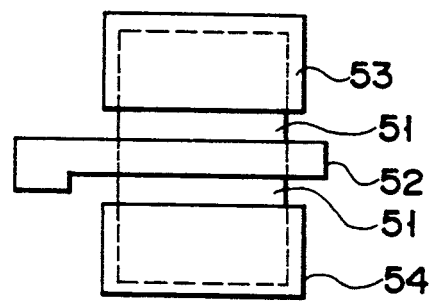
F I G. 7B
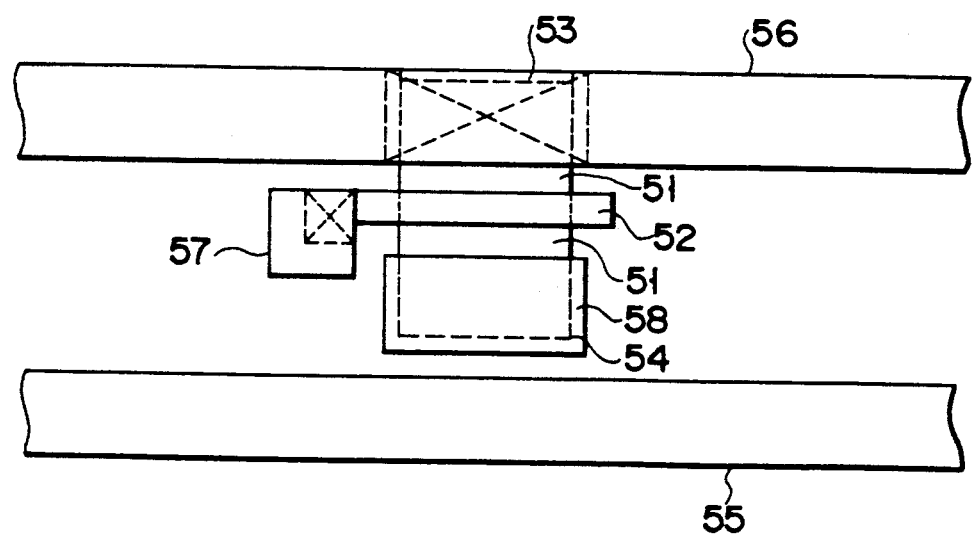
F I G. 7C

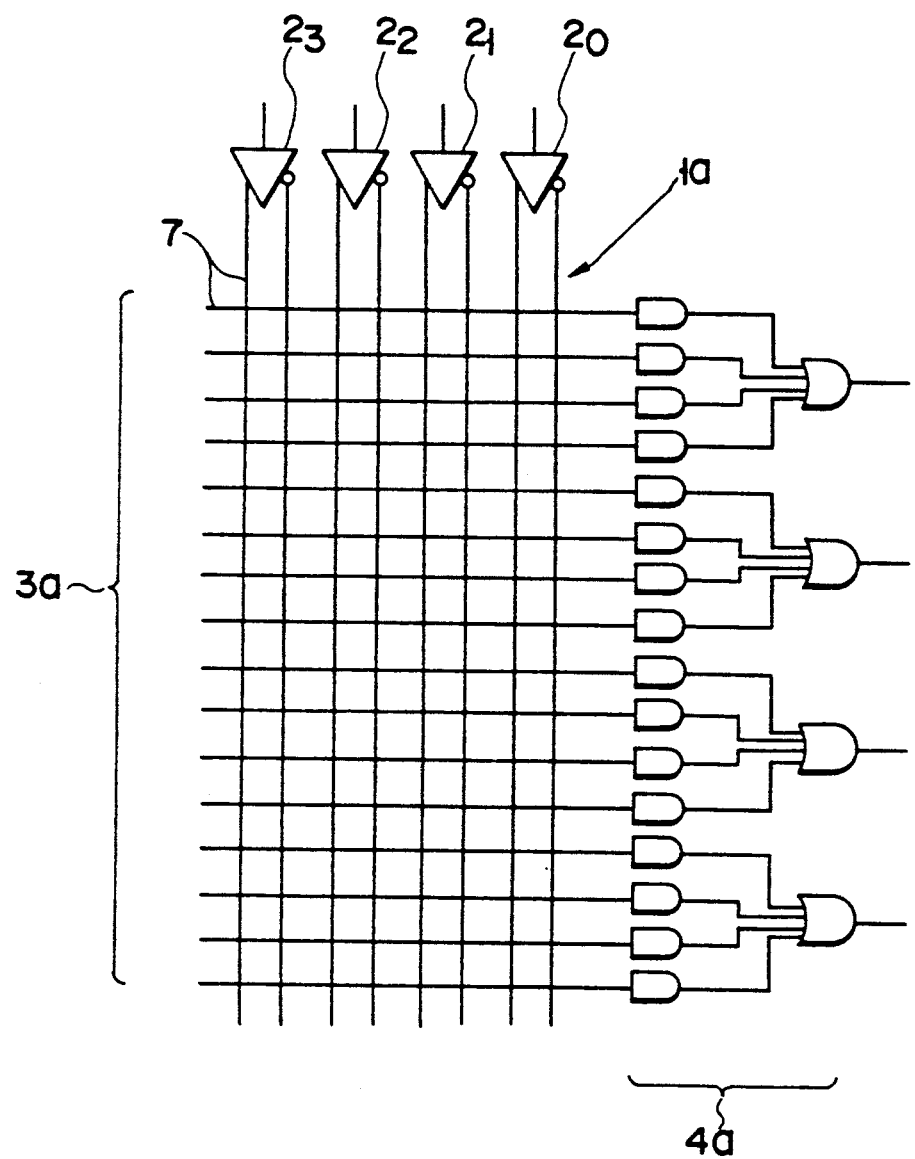
F I G. 8

SEMICONDUCTOR INTEGRATED CIRCUIT APPARATUS HAVING PROGRAMMABLE LOGIC DEVICE

BACKGROUND OF THE INVENTION

1. Field of the Invention

The present invention relates to a semiconductor integrated circuit apparatus and, more particularly, to a semiconductor integrated circuit apparatus having a programmable logic device (to be referred to as a PLD hereinafter).

2. Description of the Related Art

In recent years, semiconductor integrated circuit apparatuses capable of programming a logic gate called a PLD have been commercially available.

FIG. 1 shows a part of a PLD formed on a conventional bipolar integrated circuit. In FIG. 1, reference numerals 81 and 82 denote logic input terminals; 83 and 84, logic input inverting signal forming inverters; 85, a programming region; 86 to 88, logic circuits; and 89, a logic output terminal. The programming region 85 is arranged so that at least a specific one of fuses F respectively connected in series with a plurality of diodes D is fused to program the PLD.

This programming system is the simplest one. According to this system, on the user's side, a large current is supplied to unnecessary fuses to melt the fuses according to a desired logic circuit diagram after the shipment, or on the manufacturer's side, a laser beam is radiated onto unnecessary fuses to melt the fuses before shipment.

Another programming system is a system in which a conductive layer is formed to form a desired wiring portion.

Still another conventional programming system is available. That is, like the programming region shown in FIG. 2, a plurality of wires are arranged in vertical and lateral directions, switches SW which is passive elements are arranged at crossing points of the wires, and ON/OFF states of the switches are controlled to form desired circuit connections. In this case, reference numerals 91 and 92 denote logic input terminals; 93 and 94, logic input inverting inverters; 95, a programming region; 96 to 98, logic gate circuits; and 99, a logic output terminal. As the switch SW, memory cells such an EPROM (ultraviolet erasable programmable read-only memory) or an EEPROM (electrically erasable programmable read-only memory) which includes floating gate MOS transistors are used. Vertical and lateral wires at crossing points are connected/disconnected by writing data "0" or "1" to the memory cells.

According to the above programming system using fuses or the programming system using switches as passive elements, after a user purchases PLD products, he or she can advantageously determine logic of LSIs by himself or herself.

However, in a programming system using fuses, dust appears after the fuse is melted to form a desired logic circuit diagram. In addition, after products are shipped from a factory of a manufacturer, it cannot be estimated whether or not fuse portions to be formed by the user are good. Therefore, a non-defective ratio of 100% of the programmed products cannot be ensured. According to a desired logic circuit diagram, most of fuses must be melted in normal use, and this is troublesome. This is a reason for decreasing a non-defective ratio of programmed products.

In the above programming system using the switches SW consisting of memory cells as passive elements, since the passive elements connected to the logic input terminals 91 and 92 necessarily have stray capacitances, and the capacitances are adversely affect the PLD to delay an input signal propagation time, thereby disabling a high-speed operation of the PLD. Since a method of programming the memory cells used for the switches SW is complicated, a large-scale programming device using a personal computer or the like is required. In addition, a user must spend a long time to develop software for programming a PLD. Otherwise, the user must purchase software and a corresponding expensive programming device.

In the above programming system in which a conductive material is attached to a circuit to form a desired wiring portion, when products are shipped from a factory of a manufacturer, it cannot be estimated whether the products are good or not. Therefore, defective products are sent to a user, and a 100% non-defective ratio of the programmed products cannot be ensured. This programming system is not technically stable enough.

As described above, according to a conventional semiconductor integrated circuit apparatus, the following problems are posed. That is, when a programming system using fuses is employed, a non-defective ratio of programmed products is decreased. When a programming system using switches as passive elements is employed, the high-speed operation of a PLD is disabled.

SUMMARY OF THE INVENTION

It is an object of the present invention to provide a semiconductor integrated circuit apparatus realized by a simple process and capable of shipping products with a non-defective ration of 100% and of achieving a high-speed operation of a PLD.

According to the present invention, there is provided a semiconductor integrated circuit apparatus having a programmable logic gate, wherein whether an opening for connecting a metal wire in a programming region is present or absent is determined in a manufacturing step according to a content of a program in the programming region, the program is performed by determining whether a programming element is connected to the metal wire through the opening or not.

According to the present invention, unnecessary portions of a programming element are completely separated from input/output wires, and an element portion having a stray capacitance for delaying a signal propagation time is completely separated from the input/output wire. Therefore, a circuit operation can be performed at an extremely high speed, and only one step is required to determine whether an opening is present or absent. Since this programing is performed on the manufacturer's side, perfect evaluation for logic circuits required by a user can be performed before products are shipped from a factory of the manufacturer. In addition, the programmed logic circuits with a non-defective ratio of 100% can be shipped.

According to the present invention, there is provided a semiconductor integrated circuit apparatus realized by a simple process and capable of shipping products with a non-defective ration of 100% and of achieving a high-speed operation of a PLD.

In recent years, since a whole system to which a PLD is applied has been rapidly developed to have a high-speed operation, a PLD which is frequently used as a peripheral device of the system necessarily has a high-speed operation, achievement of the high-speed operation itself is one of good advantages.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 and 2 are circuit diagrams showing a part of a conventional PLD;

FIGS. 7A to 7D are views of patterns showing steps of forming a programming region using the programming element shown in FIG. 6; and FIG. 8 is a circuit diagram showing a programming region in FIG. 3 according to another embodiment of the present invention.

DETAILED DESCRIPTION OF THE PREFERRED EMBODIMENTS

An embodiment of the present invention will be described below with reference to the accompanying drawings.

Figure 3:
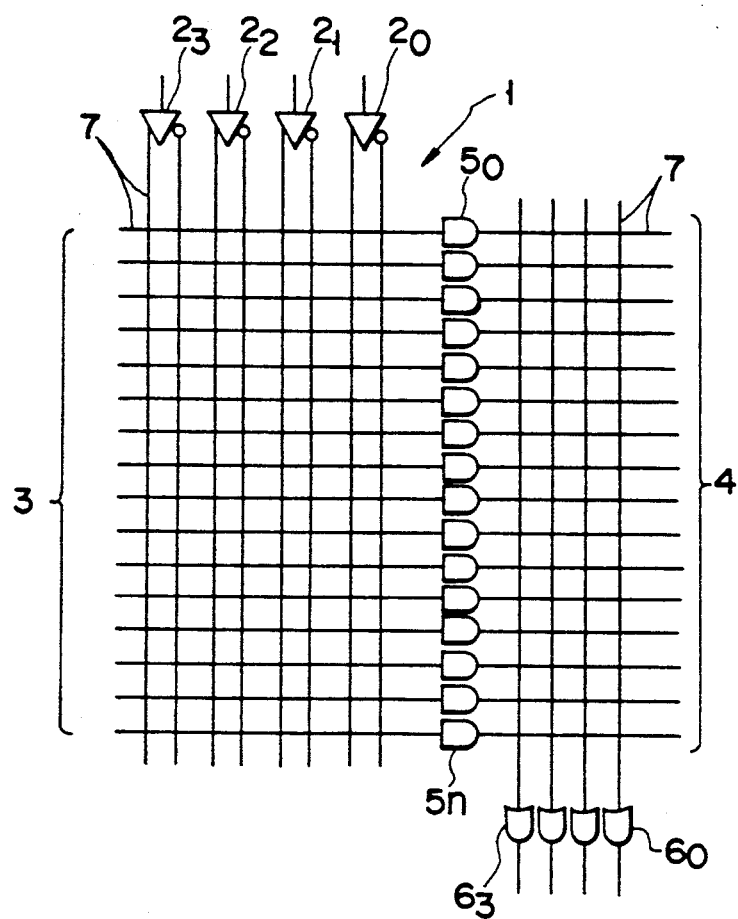
FIG. 3 is a circuit diagram showing a programming region of a semiconductor integrated circuit apparatus according to an embodiment of the present invention.

FIG. 3 exemplifies a programming region 1 having AND and OR regions formed on a PLD. It is determined according to the content of a program whether each opening for connecting a metal wire is present or absent in the programming region 1 in the manufacturing step. The program is performed by checking whether a programming element is connected to the metal wire through this opening or not.

In the programming region 1, reference numerals $2_0$ to $2_3$ denote input gates; 3, an AND region; 4, an OR region; $5_0$ to $5_n$, gates between the AND region 3 and the OR region 4; and $6_0$ to $6_3$, output gates of the OR region 4. Elements such as a diode, an FET, and the like to be described later are selectively connected to crossing points of matrix wires 7 in the AND and OR regions 3 and 4 to perform a program.

In the programming region 1, since the AND and OR regions 3 and 4 are programmable, a form of a logical expression of a logic circuit to be realized has a degree of freedom, and the number of AND terms can be decreased using a common product.

Figures 4, 5, 6:
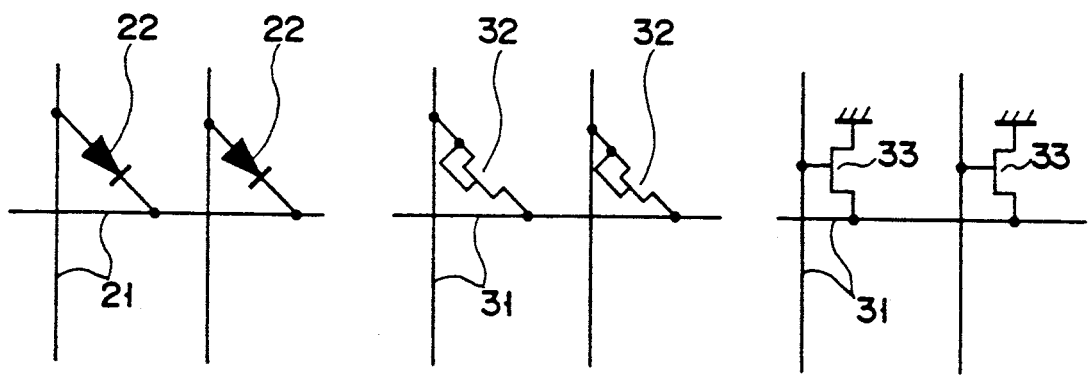
FIGS. 4 to 6 are circuit diagrams each showing a part of each crossing point of a matrix wire portion in FIG. 3.

FIG. 4 shows two crossing points of the matrix metal wires 7 in the programming region 1. Of diodes 22 formed near the respective crossing points of metal wires 21 which are formed on a semiconductor substrate in a matrix form, both terminals of some diodes 22 to be used are connected to the wires 21 through openings formed in correspondence with both the terminals serving as an anode and a cathode of the diodes 22 (these connecting points are represented by marks ●). The remaining diodes 22 not to be used are not electrically connected to the metal wires 21.

FIGS. 5 and 6 show parts of crossing points of matrix metal wires 31 in a programming region formed on a gallium arsenide (GaAs) integrated circuit. A metal Schottky field effect transistor (MESFET) 32 or an MESFET 33 a gate and a drain of which are connected (diode-connected) to each other near each crossing point of the metal wires 31 is formed. In FIG. 5, as in FIG. 4, both terminals of only the MESFET 32 which is to be used and a gate and a drain which are diode-connected to each other are connected to the metal wires 31 through openings formed in correspondence with both the terminals (a gate/drain terminal and a source terminal). In FIG. 6, as in FIG. 4, the gate and drain terminals of only the MESFET 33 to be used are connected to the wires 31 through openings formed in correspondence with the gate and drain portions.

A process for forming a programming region using the MOSFET 33 in FIG. 6 will be described below with reference to FIGS. 7A to 7D.

As described in FIG. 7A, an active layer 51 prospectively serving as a channel region of the FET is formed in a surface of a semi-insulating GaAs substrate by ion implantation, and a gate electrode 52 is formed on a part of the substrate including the channel region.

As shown in FIG. 7B, a region prospectively serving as the source/drain region of the FET is heavily doped by ion implantation to form source and drain regions, and ohmic metal electrodes 53 and 54 contacting the source and drain regions are formed on the substrate.

As shown in FIG. 7C, an output wire 55 and a ground wire 56 connected to the electrode 53 are formed by a first metal wiring layer, and a first contact portion 57 for the first metal wiring layer connected to the gate electrode 52 is formed. A second contact portion 58 for the first metal wiring layer and for covering the electrode 54 is formed.

Figure 7D:
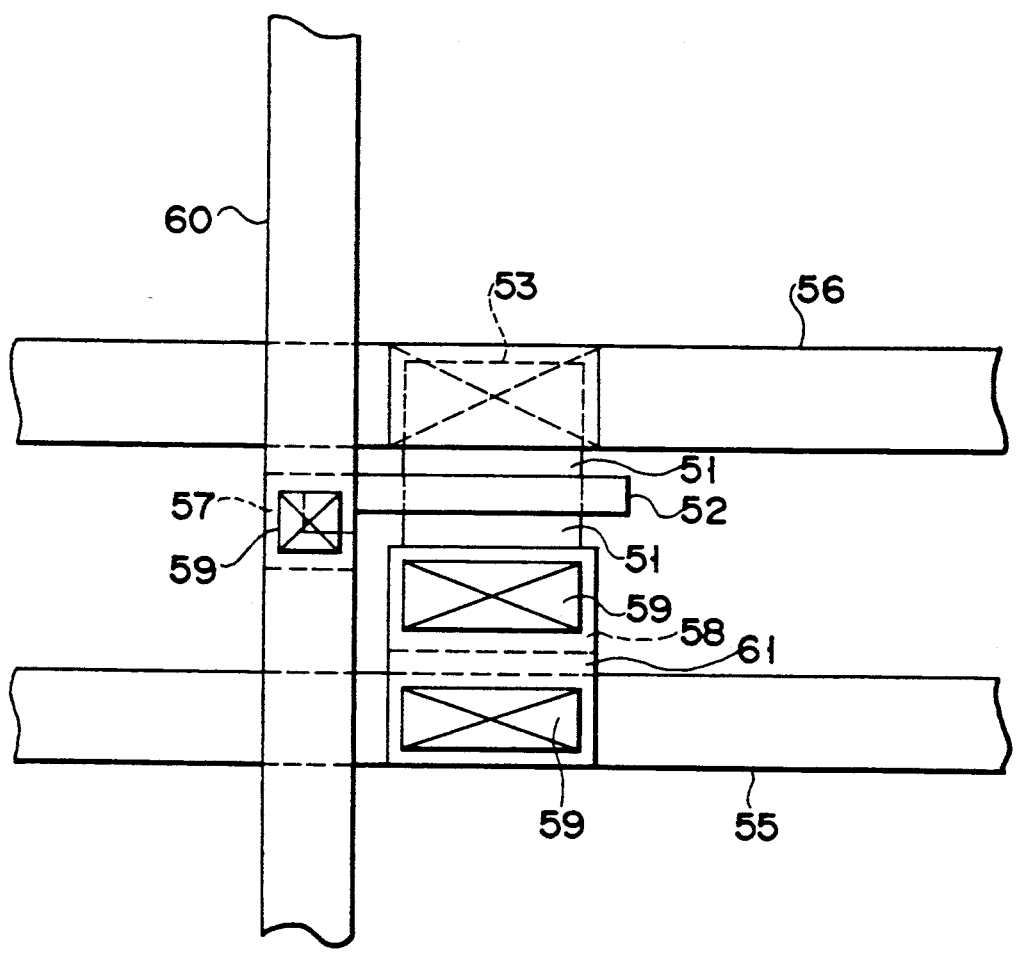

As shown in FIG. 7D, when through holes 59 for connecting the first and second metal wiring layers are to be formed, whether the through holes 59 are formed or not is determined by determining whether the FET 33 is connected to a portion required to realize a desired logic circuit. Sequentially, an input wire 60 and a wire 61 for connecting the output wire 55 to the second contact portion for the first metal wiring layer are formed by the second metal wiring layer to pass over the first contact portion 57 for the first metal wiring layer.

In a practical PLD, a programming region having AND and OR regions are used in many cases. Another embodiment of the programming region 1 in FIG. 3 is shown in FIG. 8.

In a programming region 1a shown in FIG. 8, reference numeral 3 denotes an AND region; and 4a, an OR region. In the programming region 1a, programming is performed to selectively connect the above programming elements to crossing points of the matrix wires 7 in the AND region 3.

In the programming region 1a, the OR region 4a is not programmable. That is, the pattern of the OR region 4a is fixed, and only the AND region 3 is programmable. Therefore, since the programming region 1a has a programmable area smaller than that of the programming region 1 in FIG. 3, a signal propagation time from an input to an output is short, and an operation speed of a circuit can be further increased.

According to the PLD of the above embodiment, whether a through hole or a contact hole in a programming region is present or absent is determined in a manufacturing step (a step of forming a through hole or a step of forming a contact hole) according to the content of a program in the programming region, and the program is performed by determining whether a programming element is connected to a metal wire through the opening or not. In this case, since the program is performed by determining whether the through hole or the contact hole is present or absent, a user cannot disadvantageously determine logic of LSIs by himself or herself after he or she purchases PLD products.

However, unnecessary portions of programming elements (a diode, an FET, or the like) which are not used are completely separated from input/output wires, and an element portion having a stray capacitance for delaying a signal propagation time is completely separated from the input/output wire. Therefore, a circuit operation can be performed at an extremely high speed, because only some of a large number of programming elements formed in a programming region are used in a practical logic circuit and many remaining elements ar not used.

Therefore, in order to achieve a high-speed operation, when the present invention is applied to a PLD having of a programming region in which the pattern of the OR region 4a is fixed and only the ADD region 3 is programmable, as shown in FIG. 8, a large merit can be obtained.

Only one step is required to determine whether a through hole or a contact hole is present or absent. In this case, when whether the through hole or a contact hole is present or absent is determined in a step using a through hole mask or a contact hole mask, a program can be performed in only a step of simply forming a semiconductor integrated circuit apparatus without requiring a special technique. Therefore, stability of the process can be obtained, and a high yield of products can be easily obtained.

The step of forming the through hole or the contact hole may be performed not be the through hole mask or the contact hole mask but by a direct drawing method using an electron beam or the like. Since only some of the large number of programming elements are used and many remaining elements are not used, a long time is not required even when the direct drawing method using an electron beam or the like is used.

According to the PLD of the above embodiment, since a program is performed on the manufacturer's side, perfect evaluation for logic circuits required by a user can be performed before products are shipped from a factory of the manufacturer. In addition, the programmed logic circuits having a non-defective ratio of 100% can be shipped.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit apparatus comprising:
    a programming region having an AND region and an OR region, wherein
    said AND region and said OR region are programmed, whether an opening for connecting a metal wire in said programming region is present or absent is determined in a manufacturing step in accordance with a content of a program performed in said programming region, and the program is performed by determining whether a programming element is connected to said metal wire through said opening or not.

2. An apparatus according to claim 1, wherein said opening for connecting said metal wire is a through hole of a multi-layered wiring.

3. An apparatus according to claim 1, wherein said through hole of said multi-layered wiring is a through hole for connecting a first metal wiring layer to a second metal wiring layer.

4. An apparatus according to claim 1, wherein said opening for connecting said metal wire is a contact hole for connecting metal wires to some of devices except for metal wires.

5. An apparatus according to claim 1, wherein said programming element is a metal Schottky field effect transistor formed on a gallium arsenide substrate.

6. A semiconductor integrated circuit apparatus on which a programmable logic gate is formed, comprising:
    a programming region having an AND region and an OR region, wherein
    a pattern of said OR region is fixed, programming is performed in said AND region, whether an opening for connecting a metal wire in said programming region is present or absent is determined in a manufacturing step in accordance with a content of a program performed in said programming region, and the program is performed by determining whether a programming element is connected to said metal wire through said opening or not.

7. An apparatus according to claim 6, wherein said opening for connecting said metal wire is a through hole of a multi-layered wiring.

8. An apparatus according to claim 6, wherein said through hole of said multi-layered wiring is a through hole for connecting a first metal wiring layer to a second metal wiring layer.

9. An apparatus according to claim 6, wherein said opening for connecting said metal wire is a contact hole for connecting metal wires to some of devices except for metal wires.

10. An apparatus according to claim 6, wherein said programming element is a metal Schottky field effect transistor formed on a gallium arsenide substrate.

* * * * *

REEXAMINATION CERTIFICATE (2005th)

United States Patent [19]

Iwasaki

[11] B1 5,068,549

[45] Certificate Issued    May 11, 1993

[54] SEMICONDUCTOR INTEGRATED CIRCUIT APPARATUS HAVING PROGRAMMABLE LOGIC DEVICE

[75] Inventor: Hiroshi Iwasaki, Yokohama, Japan

[73] Assignee: Kabushiki Kaisha Toshiba, Kawasaki, Japan

Reexamination Request:
No. 90/002,579, Feb. 10, 1992

Reexamination Certificate for:
Patent No.: 5,068,549
Issued: Nov. 26, 1991
Appl. No.: 614,261
Filed: Nov. 16, 1990

[30] Foreign Application Priority Data

Nov. 20, 1989 [JP]  Japan ................. 1-299856

[51] Int. Cl.⁵ ............. H03K 19/177; H03K 5/08; H03K 19/092; H03K 3/01

[52] U.S. Cl. ................... 307/465.1; 307/468; 307/202.1; 364/784

[58] Field of Search .............. 307/465, 465.1, 468, 307/202.1, 466, 467; 357/45

[56] References Cited

U.S. PATENT DOCUMENTS

| | | | |
|---|---|---|---|
| 4,207,556 | 6/1980 | Sugiyama et al. | 307/467 |
| 4,642,487 | 9/1984 | Carter | 307/465 |
| 4,689,654 | 8/1987 | Brockman | 307/468 |
| 4,703,206 | 10/1987 | Cavalan | 307/465 |
| 4,868,426 | 9/1989 | Brockmann | 307/465 |

*Primary Examiner*—Timothy P. Callahan

[57]    ABSTRACT

According to this invention, there is disclosed a semiconductor integrated circuit apparatus having a programmable logic gate wherein whether an opening for connecting a metal wire in a programming region is present or absent is determined in a manufacturing step by determining the content of a program in the programming region, and the program is performed by determining whether a programming element is connected to the metal wire through the opening or not.

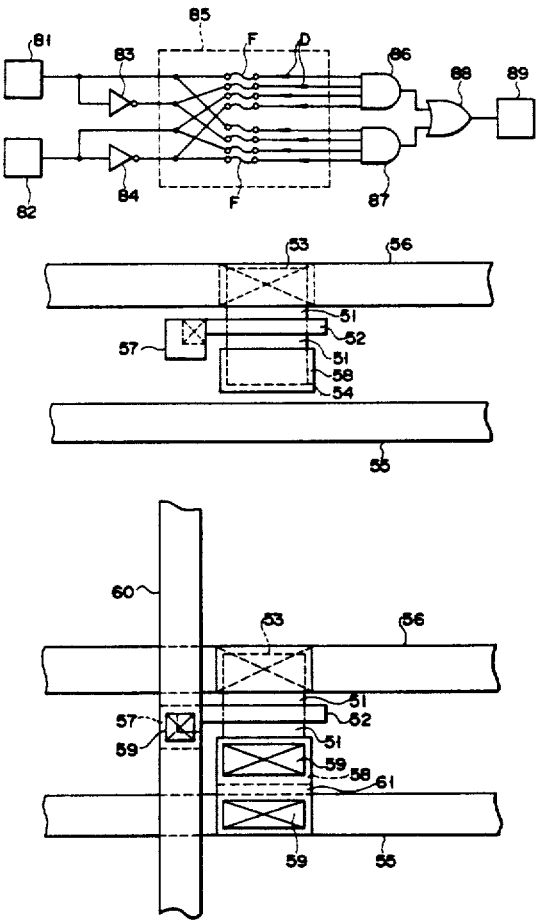

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 6 are cancelled.

Claims 2-5 and 7-10 are determined to be patentable as amended.

New claims 11-14 are added and determined to be patentable.

2. An apparatus according to claim [1] *11*, wherein [said opening for connecting said metal wire is a through hole] *the corresponding openings are through holes* of a multi-layered wiring.

3. An apparatus according to claim [1] *2*, wherein said through [hole of said multi-layered wiring is a through hole for connecting a first metal wiring layer to a second metal wiring layer] *holes are in alignment with the first wires.*

4. An apparatus according to claim [1] *11, further including a contact portion coupled to one of the programming elements,* wherein [said opening for connecting said metal wire is a contact hole for connecting metal wires to some of devices except for metal wires] *a corresponding opening is in alignment with the contact portion.*

5. An apparatus according to claim [1] *11*, wherein [said programming element is a metal Schottky field effect transistor formed] *a programming element is arranged in a metal Schottky field effect transistor configuration* on a gallium arsenide substrate.

7. An apparatus according to claim [6] *12*, wherein [said opening for connecting said metal wire is a through hole] *the corresponding openings are through holes* of a multi-layered wiring.

8. An apparatus according to claim [6] *7*, wherein said through [hole of said multi-layered wiring is a through hole for connecting a first metal wiring layer to a second metal wiring layer] *holes are in alignment with the first wires.*

9. An apparatus according to claim [6] *12, further including a contact portion coupled to one of the programming elements,* wherein [said opening for connecting said metal wire is a contact hole for connecting metal wires to some of devices except for metal wires] *a corresponding opening is in alignment with the contact portion.*

10. An apparatus according to claim [6] *12*, wherein [said programming element is a metal Schottky field effect transistor formed] *a programming element is arranged in a metal Schottky field effect transistor configuration* on a gallium arsenide substrate.

*11. A semiconductor integrated circuit apparatus comprising:*

*a programming region having an AND region and an OR region;*
  *a plurality of gates, each gate including an input and an output;*
  *a plurality of first wires in the AND region, each first wire including a metal;*
  *a plurality of second wires in the AND region, each second wire coupled to the input of one of the gates, each second wire including a metal;*
  *a plurality of first programming elements, in the AND region, each including*
    *a semiconductor region,*
    *a first terminal opposed to the semiconductor region, and*
    *a second terminal opposed to the semiconductor region,*
  *wherein selected ones of the first programming elements have the first terminal electrically coupled to a corresponding one of the first wires through an opening defined by the programming region, and have the second terminal electrically coupled to a corresponding one of the second wires through an opening defined by the programming region, and wherein each first programming element other than the selected ones have the first and second terminals both electrically isolated from the plurality of first wires and from the plurality of second wires;*
  *a plurality of third wires in the OR region, each third wire coupled to the output of one of the gates, each third wire including a metal;*
  *a plurality of fourth wires in the OR region, each fourth wire including a metal;*
  *a plurality of second programming elements, in the OR region, each including*
    *a semiconductor region,*
    *a first terminal opposed to the semiconductor region, and*
    *a second terminal opposed to the semiconductor region,*
  *wherein selected ones of the second programming elements have the first terminal electrically coupled to a corresponding one of the third wires through an opening defined by the programming region, and have the second terminal electrically coupled to a corresponding one of the fourth wires through an opening defined by the programming region, and wherein each second programming element other than the selected ones have the first and second terminals both electrically isolated from the plurality of third wires and from the plurality of fourth wires.*

*12. A semiconductor integrated circuit apparatus comprising:*
  *a programming region having an AND region and an OR region, the OR region having a fixed pattern;*
  *a plurality of OR gates in the OR region, each OR gate including an input;*
  *a plurality of first wires in the AND region, each first wire including a metal;*
  *a plurality of second wires in the AND region, each second wire coupled to the input of one of the OR gates, each second wire including a metal;*
  *a plurality of programming elements, in the AND region, each including*
    *a semiconductor region,*
    *a first terminal opposed to the semiconductor region, and*
    *a second terminal opposed to the semiconductor region,*
  *wherein selected ones of the programming elements have the first terminal electrically coupled to a corresponding* one of the first wires through an opening defined by the programming region, and have the second terminal electrically coupled to a corresponding one of the second wires through an opening defined by the programming region, and wherein each programming element other than the selected ones have the first and second terminals both electrically isolated from the plurality of first wires and from the plurality of second wires.

13. An apparatus according to claim 11, further including a plurality of buffers, each buffer including a first output coupled to another respective one of the plurality of first wires; and a second output coupled to another respective one of the plurality of first wires, the second output being complementary to the first output.

14. An apparatus according to claim 12, further including a plurality of buffers, each buffer including a first output coupled to a respective one of the plurality of first wires; and a second output coupled to another respective one of the plurality of first wires, the second output being complementary to the first output.

* * * * *